United States Patent
Kyouno et al.

(10) Patent No.: US 7,847,589 B2
(45) Date of Patent: Dec. 7, 2010

(54) CONFIGURATION DATA FEEDING DEVICE

(75) Inventors: Toshihisa Kyouno, Kawasaki (JP);
Kenichi Miyama, Kawasaki (JP);
Nobuyuki Kobayashi, Kawasaki (JP);
Noboru Shimizu, Kaawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/625,730

(22) Filed: Nov. 25, 2009

(65) Prior Publication Data
US 2010/0066408 A1    Mar. 18, 2010

Related U.S. Application Data

(63) Continuation of application No. PCT/JP2007/061826, filed on Jun. 12, 2007.

(51) Int. Cl.
*H03K 19/177* (2006.01)
(52) U.S. Cl. .......................................... 326/41; 326/38
(58) Field of Classification Search ............. 326/37–41, 326/46
See application file for complete search history.

(56) References Cited

U.S. PATENT DOCUMENTS

| | | | | |
|---|---|---|---|---|
| 5,448,496 A | * | 9/1995 | Butts et al. | 716/16 |
| 7,640,155 B2 | * | 12/2009 | Poplack et al. | 703/23 |
| 2005/0267729 A1 | * | 12/2005 | Poplack et al. | 703/25 |
| 2007/0182445 A1 | * | 8/2007 | Chen et al. | 326/39 |

FOREIGN PATENT DOCUMENTS

| | | |
|---|---|---|
| JP | 11-144662 | 5/1999 |
| JP | 2000-278116 | 10/2000 |
| JP | 2003-44303 | 2/2003 |
| JP | 2004-343158 | 12/2004 |
| JP | 2005-259053 | 9/2005 |

OTHER PUBLICATIONS

International Search Report dated Sep. 4, 2007, from the corresponding International Application.

* cited by examiner

*Primary Examiner*—Don P Le
(74) *Attorney, Agent, or Firm*—Katten Muchin Rosenman LLP

(57) ABSTRACT

A configuration data feeding device for feeding configuration data to a plurality of FPGAs includes a memory for storing configuration data that are fed to the plurality of FPGAs, a plurality of interface units for outputting the configuration data read out from the memory, according to their specific configuration layouts, an interface selection unit for selecting, out of the plurality of interface units, an interface unit that is to be used for configuring each of the plurality of FPGAs, and a circuit-switching unit for switching the circuits that connect the FPGAs to the interface units depending upon the selection by the interface selection unit.

7 Claims, 7 Drawing Sheets

| FPGA No. | INTERFACE No. |
|---|---|
| 1 | 2 |
| 2 | 4 |
| 3 | 3 |
| ⋮ | ⋮ |
| n | 7 |

| FPGA No. | INTERFACE No. |
|---|---|
| 1 | 2 |
| 2 | 4 |
| 3 | 3 |
| 4 | 2 |
| ⋮ | ⋮ |
| n | 7 |

| FPGA No. | INTERFACE No. |
|---|---|
| 1 | 2 |
| 2 | 4 |
| 3 | 3 |
| 4 | |
| ⋮ | ⋮ |
| n | 7 |

| INTERFACE No. | MANUFACTURER |
|---|---|
| 1 | A |
| 2 | B |
| 3 | C |
| ... | ... |
| n | X |

FIG.10

| FPGA No. | MANUFACTURER |
|---|---|
| 1 | X |
| 2 | A |
| 3 | C |
| ... | ... |
| n | B |

CONFIGURATION DATA FEEDING DEVICE

CROSS REFERENCE TO RELATED APPLICATION

The present application is a continuation application based on International application No. PCT/JP2007/61826, filed on Jun. 12, 2007.

TECHNICAL FIELD

The embodiments discussed herein are related to a configuration data feeding device which feeds configuration data to FPGAS (Field Programmable Gate Arrays).

BACKGROUND

A FPGA is a gate array. The information concerning input terminals, output terminals and internal logic function circuits of the FPGA can be managed as configuration data, and the logic circuit of the FPGA can be changed in the field. Therefore, FPGA has now been widely used in data processing systems and communication systems as a hardware featuring a high degree of general applicability.

The configuration data is stored in an external memory separate from the FPGAs, read out as required from the external memory and written into the FPGAs. Upon determining the configuration of the FPGAs, a hardware function can be realized based on the configuration data.

When a plurality of FPGAs are to be configured, a dedicated configuration circuit is provided for each of the FPGAs results in a problem concerning the cost and mounting areas on the circuit board.

According to the computer system described in Japanese Laid-open Patent Publication No. 2005-259053, as illustrated in FIG. 1, a data distribution function unit is provided to store the configuration data for a plurality of FPGAs in a flash ROM and to distribute the data to the plurality of FPGAs in an attempt to share the memory for storing the configuration data, and therefore decrease the number of parts.

The computer system 90 illustrated in FIG. 1 includes a configuration circuit which has an FROM (flash memory) 91 for storing the configuration data of FPGAs 91a to 94c, a CPU 92 and an FPGA data distribution function unit 93; and the FPGAs 94a to 94c which start working upon downloading the configuration data from the FPGA data distribution function unit 93.

FIG. 2 is a block diagram illustrating the constitution of the FPGA data distribution function unit 93. The FPGA data distribution function unit 93 includes an FROM access control unit 100, a sequence identification unit 101, first to third manufacturer identification units 102, 103 and 104, first to third FPGA interface units 105, 106 and 107, and a configuration completion detector unit 108. The FROM access control unit 100 reads out the configuration data stored in the FROM 91, discontinues the access to the FROM 91 when setting the configuration data has finished, and relays the access from the CPU 92 to the FROM 91.

The sequence identification unit 101 identifies the kind of sequence from the configuration data read out from the FROM access control unit 100, and outputs the configuration data to a path which is designated based on the kind of sequence that is identified.

The manufacturer identification units 102, 103 and 104 identify the manufacturers from the configuration data output to the paths, and output the identification of the manufacturers together with the configuration data.

Based on the identification of the manufacturers, the FPGA interface units 105, 106 and 107 convert the configuration data into the data of layouts specific to the manufacturers and output them.

The configuration completion detector unit 108 monitors the configuration statuses of the FPGAs 94a to 94c, and send them to the FROM access control unit 100.

Japanese Laid-open Patent Publication JP-11-144662 discloses an image processing apparatus in which a controller selects a configuration data out of a plurality of configuration data to start up the configuration.

SUMMARY

The configuration data feeding device for feeding configuration data to a plurality of FPGAs according to the embodiment includes a memory which stores configuration data that are to be fed to the plurality of FPGAs, a plurality of interface units which output the configuration data read out from the memory, according to their specific configuration layouts, an interface selection unit which selects, among the plurality of interface units, an interface unit that is to be used for configuring each of the plurality of FPGAs, and a circuit-switching unit which switches the circuits that connect the FPGAs to the interface units depending upon the selection by the interface selection unit.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 4 is a diagram illustrating a first example of a correspondence table;

FIG. 5 is a diagram illustrating a second example of the correspondence table;

FIG. 9 is a diagram illustrating a table for storing the manufacturers; and

FIG. 10 is a table that depicts the results of determining the manufacturers based on the device ID identification by using a device identification unit.

DESCRIPTION OF EMBODIMENTS

Figure 1:
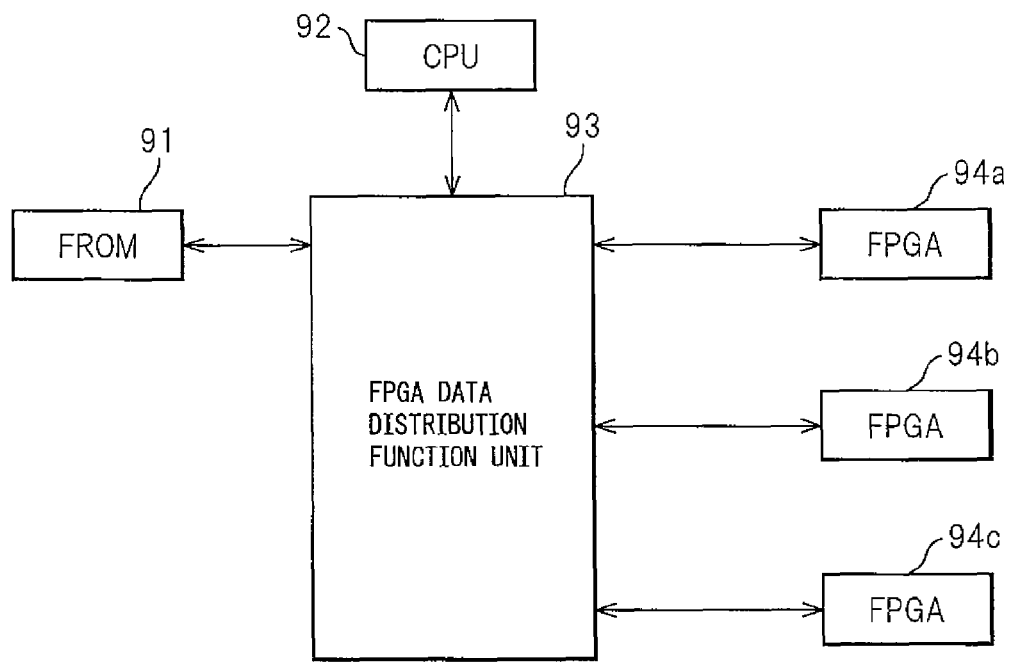
FIG. 1 is a block diagram illustrating the constitution of a conventional computer system equipped with FPGAs.
Figure 2:
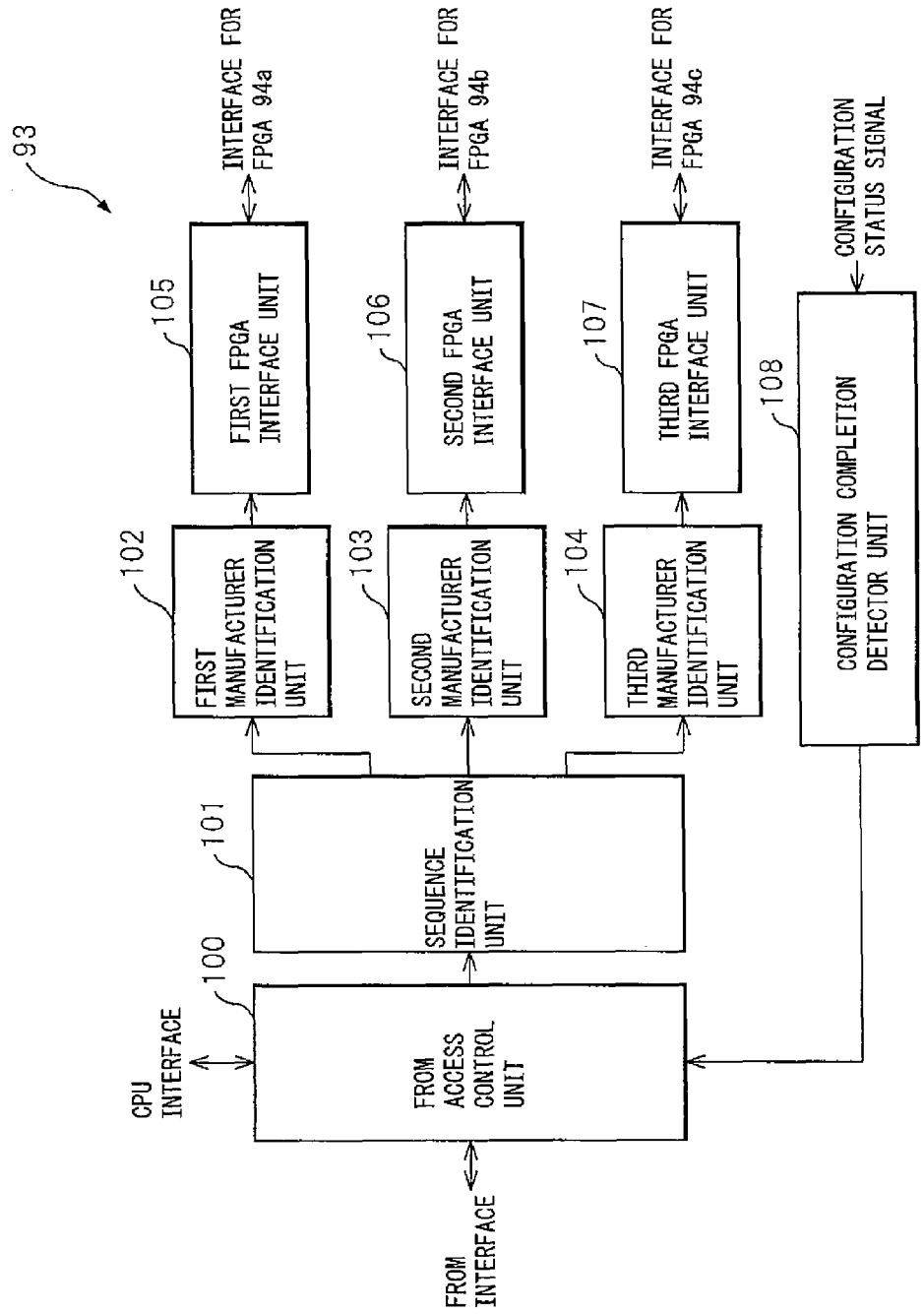
FIG. 2 is a block diagram illustrating the constitution of an FPGA data distribution function unit depicted in FIG. 1.

According to the conventional configuration circuit illustrated in FIG. 1, the memory for storing the configuration data and the control circuit for controlling the memory are shared despite use of a plurality of FPGAs, and the number of the parts can be reduced.

However, the conventional configuration circuit illustrated in FIG. 1 is provided with FPGA interface units for changing the data read out from the memory into data of input data layouts adapted to the FPGAs that are mounted. Therefore, if the manufacturer or the type of the FPGA that is mounted is changed, the layout of the FPGA interface unit in the configuration data feeding device is also changed. Accordingly, the configuration circuit is redesigned.

Further, when the plurality of FPGAs are configured by using the conventional configuration circuit, configuration is effected one by one successively. Therefore, the time for configuration becomes long in proportion to the number of the FPGAs and therefore, the time for starting up the system is extended.

According to the conventional configuration circuit, further, if a trouble occurs in the memory for storing the data and the configuration data are destroyed, then the configuration results in failure and the FPGAs cannot be started up.

Figure 3:
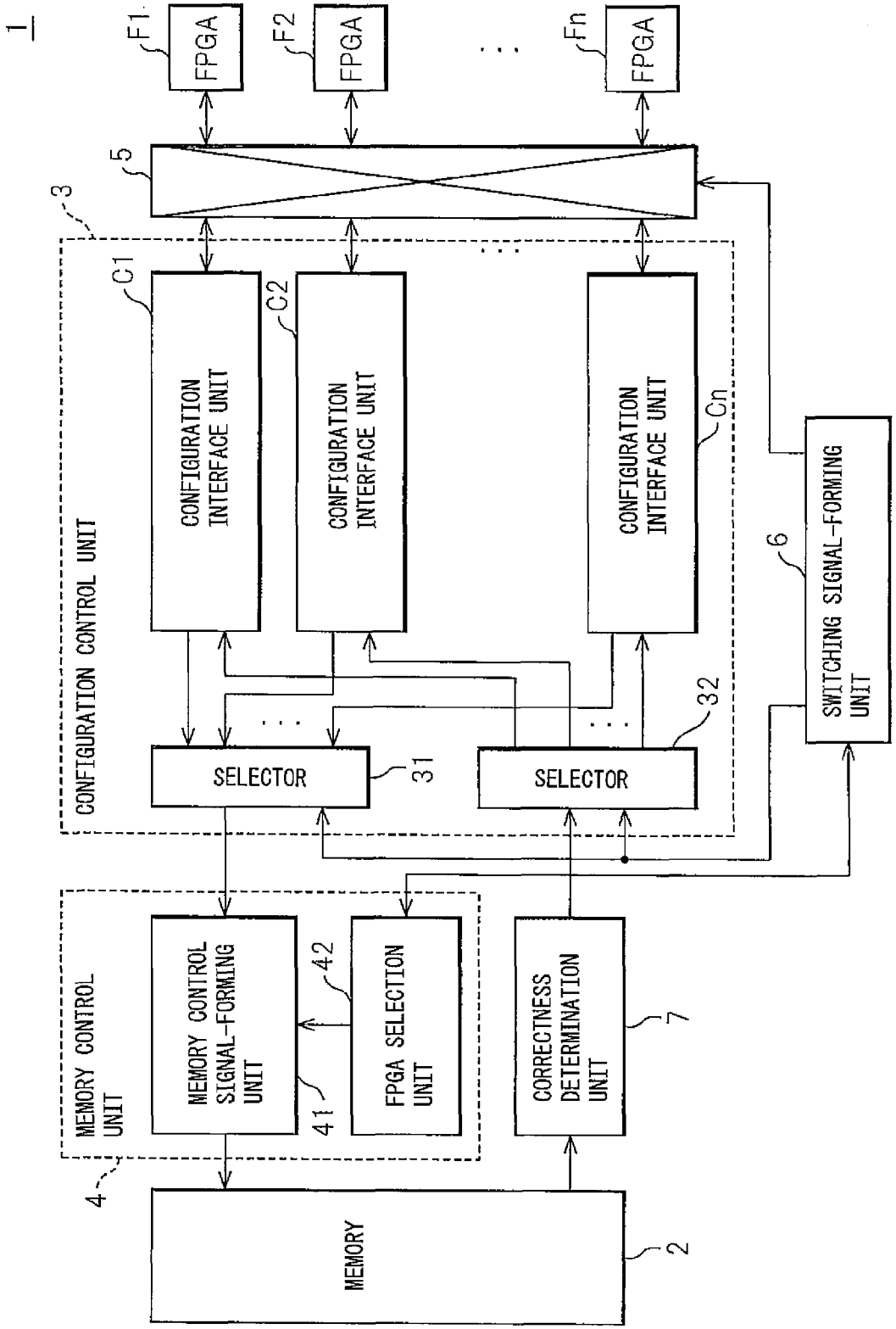
FIG. 3 is a block diagram illustrating the constitution of the configuration data feeding device according to a first embodiment.

FIG. 3 is a block diagram illustrating the constitution of the configuration data feeding device according to a first embodiment. The configuration data feeding device 1 includes a memory 2 for storing configuration data of FPGAs (F1 to Fn) of a number of n, a configuration control unit 3 for adapting the configuration data read out from the memory to the input formats requested by the FPGAs (F1 to Fn), a memory control unit 4 for forming control signals for reading the configuration data from the memory 2, a circuit-switching unit 5 for switching the circuits between the FPGAs (F1 to Fn) of the number of n and the configuration control unit 3, a switching signal-forming unit 6, and a correctness determination unit 7.

The configuration control unit 3 includes configuration interface units C1 to Cn of a number of n for rearranging the configuration data read out from the memory and for outputting them according to the specific configuration layouts.

The configuration layouts for inputting the configuration data to the FPGAs have been determined depending upon the manufacturers and the types of the FPGAs. At least some of the configuration interface units C1 to Cn output the configuration data according to configuration layouts different from those of other configuration interface units.

The switching signal-forming unit 6 stores in a memory unit (not depicted) a correspondence table T1 for defining the correspondence concerning which FPGA in the plurality of FPGAs (F1 to Fn) be configured using which one of the configuration interface units C1 to Cn.

FIG. 4 is a diagram illustrating a first example of the correspondence table T1. The illustrated example defines that the second interface unit C2 be used for configuring the FPGA(F1), the fourth interface unit C4 be used for configuring the FPGA(F2), the third interface unit C3 be used for configuring the FPGA(F3), and the seventh interface unit C7 be used for configuring the FPGA(Fn).

Reverting to FIG. 3, the switching signal-forming unit 6 controls contact points of the circuit-switching unit 5 realized by crossbar switches or the like to constitute a circuit which makes a connection between the configuration data input terminals of the FPGAs (F1 to Fn) and the configuration data output terminals of the interface units corresponded to the FPGAs in the correspondence table T1.

Relying upon the above constitution, the configuration data feeding device 1 is capable of easily changing the configuration interface unit used for configuring the mounted FPGA by simply changing the circuit constitution by using the circuit-switching unit 5.

Therefore, if the configuration layouts that can be executed by the configuration data feeding device 1 were all covered by the configuration interface units C1 to Cn, then all that are needed are to change the circuits from the circuit-switching unit 5 to the FPGAs (F1 to Fn) and rewrite the contents of the correspondence table T1 despite the type and manufacturer of the mounted FPGA are changed, and other circuit portions do not have to be changed.

The memory control unit 4 illustrated in FIG. 3 includes an FPGA selection unit 42 for successively selecting the FPGAs (F1 to Fn), and a memory control signal-forming unit 41 for forming such control signals as an address signal, a chip select signal and an output enable signal that are used at the time of reading out, from the memory 2, the configuration data for the FPGA selected by the FPGA selection unit 42.

When the configuration data are ready to be received from the memory 2, the configuration interface units C1 to Cn output a read request instruction to the memory control signal-forming unit 41.

The configuration control unit 3 includes a first selector 31 that selects any one of the control circuits for outputting the read request instructions from the configuration interface units C1 to Cn, and connects it to the memory control signal-forming unit 41. The configuration control unit 3, further, includes a second selector 32 which selects any one of the data circuits for inputting the configuration data to the configuration interface units C1 to Cn, and inputs the configuration data read out from the memory 2 to the selected data circuit.

The switching signal-forming unit 6 receives the number of the FPGA selected by the FPGA selection unit 42, and outputs the number of the configuration interface unit corresponded to the FPGA by the correspondence table T1 to the selectors 31 and 32. Therefore, the selector 31 selects the control circuit of the configuration interface unit corresponding to the FPGA selected by the FPGA selection unit 42 out of the control circuits for outputting the read request instructions of the configuration interface units C1 to Cn, and connects the selected control circuit to the memory control signal-forming unit 41.

The selector 32 selects the data circuit of the configuration interface unit corresponding to the FPGA selected by the FPGA selection unit 42 out of the data circuits to the configuration interface units C1 to Cn, and inputs the configuration data read out from the memory 2 to the selected data circuit.

Upon receipt of a read request instruction from the configuration interface unit connected by the selector 31, the memory control signal-forming unit 41 forms control signals such as the address signal, chip select signal and output enable signal for reading the configuration data that are to be fed to the FPGA selected by the FPGA selection unit 42, and reads out the configuration data from the memory 2.

The configuration data output from the memory 2 are input to the selector 32 through the correctness determination unit 7 that will be described later, input to the configuration interface unit that has output the read request instruction, and are buffered by a buffering unit in the configuration interface unit.

Thereafter, the configuration interface units C1 to Cn output the buffered configuration data to the FPGAs (F1 to Fn) through the circuit-switching unit 5.

The configuration data feeding device 1 can be so constituted that the rate of transferring the data from the memory 2 to the configuration interface units C1 to Cn is larger than the rate of transferring the configuration data to the FPGAs. In this case, while any configuration interface unit is writing the configuration data into the FPGAs, the configuration data are read out from the memory 2 and are buffered by the other plurality of configuration interface units so that the FPGAs are simultaneously configured by the plurality of configuration interface units.

The configuration interface units C1 to Cn do not have to read out the configuration data of an amount of one FPGA at one time. That is, the FPGA selection unit 42 successively selects the first FPGA through up to the n-th FPGA and reads out the configuration data from the selected FPGA. In this case, the configuration data of the amount of one FPGA may be read out only partly every time when it is selected. Namely, the operation for selecting the FPGAs may be repeated by the FPGA selection unit 42.

The number of the configuration interface units C1 to Cn may be different from the number of the FPGAs (F1 to Fn) that are mounted. Further, the number of the configuration interface units C1 to Cn may be the same as the number of the FPGAs (F1 to Fn) that are mounted, and the same configuration interface unit may be used for configuring a plurality of FPGAs.

When the plurality of FPGAs are to be configured by the same configuration interface unit, the FPGAs are configured in periods that are not overlapping. That is, the FPGAs cannot be simultaneously configured.

For this purpose, the FPGA selection unit 42 makes a reference to the correspondence table T1 stored in the switching signal-forming unit 6, and determines if the same configuration interface unit can be used for configuring a plurality of FPGAs. If the same configuration interface unit can be used for configuring the plurality of FPGAs, the FPGA selection unit 42 controls the order of the FPGAs that read out the configuration data so that the FPGAs will not be simultaneously configured.

When a signal for selecting the FPGA is input from the FPGA selection unit 42, the switching signal-forming unit 6 constitutes, by using the circuit-switching unit 5, a circuit between the FPGA specified by the selection signal and the configuration interface unit corresponded to the FPGA by the correspondence table T1.

Further, the switching signal-forming unit 6 stores in a storage unit (not depicted) a connection relationship storage table T2 for storing a combination of the FPGA to which the circuit is now constituted by the circuit-switching unit 5 and the configuration interface unit.

Figures 6, 7:
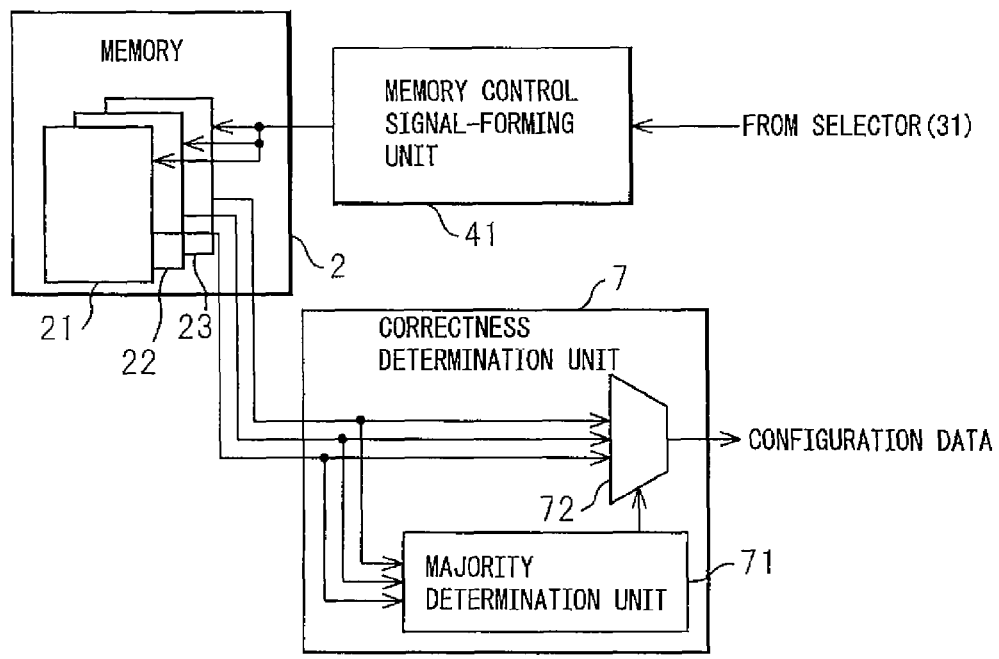
FIG. 6 is a diagram illustrating an example of the connection relationships storage table T2 that occur in the correspondence relationships depicted in FIG. 5.
FIG. 7 is a block diagram illustrating constitutions of a memory and a correctness determination unit.

FIG. 5 is a diagram illustrating an example of the correspondence table T1 for defining the correspondence between the FPGAs and the configuration interface units of when the plurality of FPGAs are to be configured by the same configuration interface unit. FIG. 6 illustrates an example of the connection relationships storage table T2 that occur in the corresponding relationships illustrated in FIG. 5. As depicted in the correspondence table T1 of FIG. 5, the second interface unit C2 is used for configuring a plurality of FPGAs (F1 and F4).

Upon receipt of a signal for selecting the FPGA from the FPGA selection unit 42, the switching signal-forming unit 6 makes a reference to the connection relationship storage table T2, and determines to which configuration interface unit the FPGA that is specified by the FPGA selection unit 42 is now being connected. When the specified FPGA is being connected to any one of the configuration interface units, the switching signal-forming unit 6 does not change the circuit constitution of the circuit-switching unit 5.

In the example depicted in FIG. 6, for example, a circuit is constituted between the FPGA (F1) and the interface unit C2. Therefore, even if the FPGA (F1) is specified by the FPGA selection unit 42, there is no change in the circuit constitution of the circuit-switching unit 5.

On the other hand, when the specified FPGA is connected to none of the configuration interface units, the switching signal-forming unit 6 constitutes, by using the circuit-switching unit 5, a circuit between the specified FPGA and the configuration interface unit corresponded to the FPGA by the correspondence table T1. Due to the above circuit constitution, if there is an FPGA of which the circuit is disconnected from the configuration interface unit, the switching signal-forming unit 6 erases the connection relationship to the FPGA from the connection relationship storage table T2.

In the example depicted in FIG. 6, for example, a circuit is constituted between the FPGA (F1) and the interface unit C2. Therefore, if the FPGA election unit 42 specifies the FPGA (F4), the switching signal-forming unit 6 constitutes a circuit between the FPGA (F4) and the interface unit C2, and erases the connection relationship between the FPGA (F1) and the interface unit C2 from the connection relationship storage table T2.

When a plurality of FPGAs are to be configured by one configuration interface unit, the FPGA control unit 42 controls the order of FPGAs to read out the configuration data in a manner, for example, as described below.

The FPGA control unit 42 controls the order of FPGAs for reading out the configuration data in a manner that after any FPGA has been configured among the plurality of FPGAs, the other FPGAs start being configured.

In the case of the corresponding relationships depicted, for example, in the correspondence table T1 of FIG. 5, the FPGA selection unit 42 selects the first FPGA (F1) through up to the third FPGA (F3) as the FPGAs that read the configuration data, skips the fourth FPGA (F4), selects the fifth FPGA (F5) through up to the n-th FPGA (Fn) and, thereafter, repeats the same selection operation.

Next, after the FPGA (F1) has been configured, the FPGA (F4) is selected as the FPGA that reads out the configuration data.

Thus, the FPGA selection unit 42 controls the order of the FPGAs that read out the configuration data in a manner that the FPGA (F4) starts configuring after the FPGA (F1) has been configured to avoid the periods of configuring the FPGAs (F1) and (F4) from overlapping.

The correctness determination unit 7 determines the correctness of the configuration data read out from the memory. FIG. 7 is a block diagram illustrating a first example of constitutions of the memory 2 and the correctness determination unit 7. The memory 2 includes a plurality of different storage regions 21 to 23. The same configuration data are stored in the plurality of different storage regions 21 to 23, redundantly. These storage regions 21 to 23 may be a plurality of different storage regions constituted by a plurality of separate storage elements or memory units, or may be a plurality of storage regions provided in different addresses in the same storage element.

Further, the correctness determination unit 7 includes a majority determination unit 71 and a selector 72 for selecting those data determined to be correct relying upon the majority of the same data read out from the plurality of different storage regions 21 to 23.

Further, instead of or in addition to the constitution illustrated in FIG. 7, the memory 2 may store parity data of configuration data in order to determine the correctness of the configuration data read out from the memory. The correctness determination unit 7 may separately calculate the parity values of the configuration data read out from the memory and compare them with the parity data stored in the memory 2 to determine the correctness of the configuration data.

Further, instead of or in addition to the constitution illustrated in FIG. 7, an ECC (error correcting code) function may be imparted to determine the correctness of the configuration data read out from the memory and to correct errors. For this purpose, the memory 2 may store ECC bits of the configuration data. When the configuration data are read out from the memory, the correctness determination unit 7 determines the correctness of the configuration data and corrects errors relying on a ECC technology.

A configuration data feeding device of the embodiment makes it possible to change connection relationships between the plurality of FPGAs and the plurality of configuration interface units by utilizing a circuit-switching unit even if the type or the manufacturer of the mounted FPGA is changed after the circuit layout has been determined. Therefore, all that is needed to accompany the change in the type or the manufacturer of the FPGA is to change a connection portion between the FPGA and the circuit-switching unit in the circuit of the configuration data feeding device.

According to the configuration data feeding device of the embodiment as described above, the plurality of FPGAs are successively selected, the configuration interface unit to be used for the selected FPGA is connected to the memory control unit, the configuration interface unit is caused to successively read the configuration data, and the configuration interface unit is caused to buffer the configuration data.

The rate of transferring the data from the memory to the configuration interface unit is larger than the rate of transferring the configuration data to the FPGA. Therefore, the configuration data can be read by the configuration interface units and can be buffered while switching over the plurality of configuration interface units within a period for configuring one FPGA.

Namely, according to the configuration data feeding device of the embodiment, the configuration data to the plurality of FPGAs stored in the same memory can be fed simultaneously and in parallel to the plurality of FPGAs. Therefore, the plurality of FPGAs can be configured in a short period of time.

Furthermore, upon providing the correctness determination unit, it is allowed to avoid such an occurrence that the FPGAs can never be normally started up due to the failure of configuration even if trouble occurs in the configuration data stored in the memory.

Figure 8:
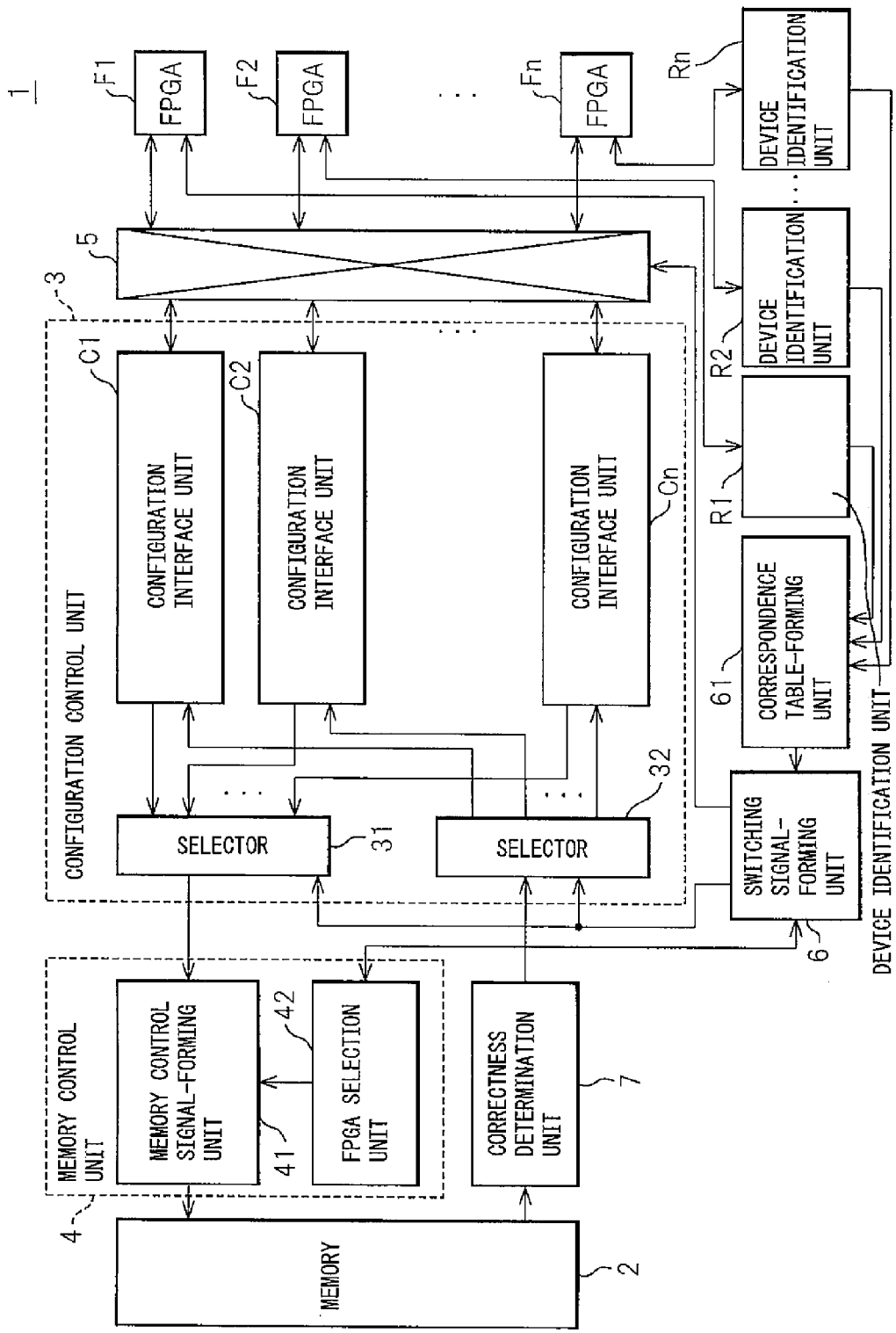
FIG. 8 is a block diagram illustrating the constitution of the configuration data feeding device according to a second embodiment.

FIG. 8 is a block diagram illustrating the constitution of the configuration data feeding device according to a second embodiment. This embodiment is equipped with device identification units R1 to Rn for identifying device IDs of the FPGAs (F1 to Fn) that are mounted, and forms the correspondence table T1 that is stored in the switching signal-forming unit 6 based on the device IDs that are identified.

The device identification units R1 to Rn output an IDCODE instruction to TAP controllers of JTAG (Joint Test Action Group) interfaces mounted on the FPGAs (F1 to Fn) to read values of device ID registers of the FPGAs (F1 to Fn).

A correspondence table-forming unit 61 forms the correspondence table T1 by determining the configuration interface units that are to be used for configuring the FPGAs based on the device IDs of the FPGAs (F1 to Fn) identified by the device identification units R1 to Rn. Described below is a method of forming the correspondence table T1 of when the configuration layouts of the FPGAs differ depending upon the manufacturers.

The correspondence table-forming unit 61 is provided with a manufacturer storage table T3 depicting the configuration interface units C1 to Cn and the manufacturers. FIG. 9 illustrates an example of the manufacturer storage table T3.

When the device IDs of the FPGAs are received from the device identification units R1 to Rn, the correspondence table-forming unit 61 specifies the manufacturers of the FPGAs (F1 to Fn) based on the device IDs. FIG. 10 depicts the results of specifying the manufacturers.

The correspondence table-forming unit 61 selects, from the manufacturer storage table T3, the configuration interface units C1 to Cn manufactured by the manufacturer specified concerning he FPGAs (F1 to Fn), and forms the correspondence table T1 for corresponding the FPGAs to the configuration interface units C1 to Cn manufactured by the manufacturers.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A configuration data feeding device for feeding configuration data to a plurality of FPGAs, comprising:
    a memory which stores configuration data that are to be fed to said plurality of FPGAs;
    a plurality of interface units which output said configuration data read out from said memory, according to their specific configuration layouts;
    an interface selection unit which selects, among said plurality of interface units, an interface unit that is to be used for configuring each of said plurality of FPGAs; and
    a circuit-switching unit which switch the circuits that connect said FPGAs to said interface units depending upon the selection by said interface selection unit.

2. The configuration data feeding device as set forth in claim 1, further comprising:
    an FPGA selection unit which successively selects, among said plurality of FPGAs, a FPGA whose configuration data is to be read out the from said memory;
    a memory control unit which reads out, from said memory, the configuration data for the FPGA selected by said FPGA selection unit; and
    a selector which connects, to said memory control unit, the control circuit from the interface unit that is to be used for said selected FPGA among the control circuits for outputting the read request instructions for requesting the read of data from said memory from said plurality of interface units to said memory control unit; wherein
    said interface units have buffers for holding the configuration data read out from said memory until being output to said FPGAs.

3. The configuration data feeding device as set forth in claim 1, further comprising device ID identification units which identifies the device IDs of said plurality of FPGAs, wherein said interface selection unit selects an interface unit to be used for the configuration based on the device IDs of said plurality of FPGAs.

4. The configuration data feeding device as set forth in any one of claim 1, further comprising a correctness determination unit which determines the correctness of the configuration data read out from said memory.

5. The configuration data feeding device as set forth in claim 4, wherein said correctness determination unit determines the correctness of said configuration data relying on the majority of a plurality of the same data stored in said memory.

6. The configuration data feeding device as set forth in claim 4, wherein said correctness determination unit determines the correctness of said configuration data relying on the parity data of said configuration data stored in said memory.

7. The configuration data feeding device as set forth in claim 4, wherein said correctness determination unit determines the correctness of said configuration data relying on the ECC bits of said configuration data stored in said memory.

* * * * *